US012765024B2

(12) United States Patent
Baba et al.

(10) Patent No.: US 12,765,024 B2
(45) Date of Patent: Oct. 13, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Masakazu Baba, Matsumoto-city (JP); Shinsuke Harada, Tsukuba-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 678 days.

(21) Appl. No.: 18/158,342

(22) Filed: Jan. 23, 2023

(65) Prior Publication Data

US 2023/0246077 A1 Aug. 3, 2023

(30) Foreign Application Priority Data

Jan. 31, 2022 (JP) ................................ 2022-012507

(51) Int. Cl.
*H10D 62/832* (2025.01)
*H10D 30/66* (2025.01)
(Continued)

(52) U.S. Cl.
CPC ....... *H10D 62/8325* (2025.01); *H10D 30/668* (2025.01); *H10D 62/153* (2025.01);
(Continued)

(58) Field of Classification Search
CPC ............. H10D 62/8325; H10D 30/668; H10D 62/153; H10D 62/157; H10D 64/62;
(Continued)

(56) References Cited

U.S. PATENT DOCUMENTS

2007/0212862 A1* 9/2007 Carta .................... H10D 8/051
438/581
2009/0283776 A1 11/2009 Iwamuro
(Continued)

FOREIGN PATENT DOCUMENTS

JP 2009278067 A 11/2009
JP 2020077664 A 5/2020
JP 2021197420 A 12/2021

OTHER PUBLICATIONS

Office Action issued in corresponding Japanese Patent Application No. 2022-012507 dated Jul. 1, 2025.

*Primary Examiner* — Julio J Maldonado
*Assistant Examiner* — Nathan Pridemore
(74) *Attorney, Agent, or Firm* — Rabin & Berdo, P.C.

(57) ABSTRACT

A silicon carbide semiconductor device, including a semiconductor substrate; a first semiconductor region and a second semiconductor region provided in the semiconductor substrate; a plurality of third semiconductor regions selectively provided in the semiconductor substrate, a plurality of first and second trenches penetrating through the second and third semiconductor regions and reaching the first semiconductor region; a plurality of gate electrodes respectively provided in the first trenches; a plurality of conductive films respectively embedded in the second trenches, junction interfaces between the first semiconductor region and the conductive films forming a plurality of Schottky barriers; a first electrode and a second electrode; and a plurality of Schottky barrier diodes that respectively include the plurality of Schottky barriers. Each conductive film includes first and second metal films, the second metal film being closer to a center of the respective second trench and having a lower electrical resistivity than the first metal film.

8 Claims, 6 Drawing Sheets

(51) Int. Cl.
*H10D 62/13* (2025.01)
*H10P 14/20* (2026.01)
*H10P 14/24* (2026.01)
*H10P 50/00* (2026.01)

(52) U.S. Cl.
CPC ........... *H10D 62/157* (2025.01); *H10P 14/24* (2026.01); *H10P 14/3442* (2026.01); *H10P 50/691* (2026.01)

(58) Field of Classification Search
CPC .... H10D 64/64; H10D 84/146; H10D 62/107; H10D 30/658; H10D 30/6738; H10D 30/608; H10D 64/107; H10D 64/0123; H10D 8/605; H01L 21/02576; H01L 21/0262; H01L 21/308; H10P 14/3442; H10P 14/24; H10P 50/691
See application file for complete search history.

(56) References Cited

U.S. PATENT DOCUMENTS

| | | | | |
|---|---|---|---|---|
| 2016/0225891 | A1* | 8/2016 | Hiyoshi | H10D 62/8325 |
| 2017/0077299 | A1* | 3/2017 | Shimizu | H01L 21/0455 |
| 2018/0269278 | A1* | 9/2018 | Yamaguchi | H10D 62/109 |
| 2020/0083369 | A1* | 3/2020 | Kobayashi | H10D 64/256 |
| 2021/0391437 | A1 | 12/2021 | Ohse | |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-012507, filed on Jan. 31, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

One commonly known semiconductor device that contains silicon carbide (SiC) as a semiconductor material (hereinafter, silicon carbide semiconductor device) is a device that has a trench gate type metal oxide semiconductor field effect transistor (MOSFET) and a Schottky barrier diode (SBD) built into a single semiconductor substrate (semiconductor chip).

In the MOSFET that shares a common semiconductor substrate with the built-in SBD, during a switching operation of the MOSFET, the built-in SBD, which has a lower forward voltage than that of a parasitic diode (body diode) formed by a pn junction between a base region and a drift region of the MOSFET, preferentially operates. Thus, reverse recovery loss of the parasitic diode is reduced. Further, the expansion of stacking faults generating during forward conduction of the parasitic diode is suppressed by the voltage distribution that accompanies the operation of the built-in SBD and degradation of forward characteristics of the parasitic diode is suppressed.

FIG. 9 is a cross-sectional view depicting a structure of a conventional silicon carbide semiconductor device. A conventional silicon carbide semiconductor device 110 depicted in FIG. 9 is a trench gate type MOSFET on a single semiconductor substrate 140 that contains silicon carbide; the trench gate type MOSFET has trench-type SBDs 130 built into the single semiconductor substrate 140 and in a front side of the semiconductor substrate 140, has trenches (hereinafter, gate trenches) 107 that are embedded, respectively, with gate electrodes 109 of the MOSFET and trenches (hereinafter, Schottky trenches) 131 that are embedded, respectively, with conductive films 132 of the trench-type SBDs 130.

A source electrode 112 of the MOSFET is configured by nickel silicide (NiSi) films 121, titanium nitride (TiN) films 122, a titanium (Ti) film 123, and an aluminum (Al) film 124 provided at a front surface of the semiconductor substrate 140. The nickel silicide films 121 are provided on portions of the front surface of the semiconductor substrate 140 exposed in contact holes of an interlayer insulating film 111 and are in ohmic contact with $n^+$-type source regions 105 and $p^{++}$-type contact regions 106. The titanium nitride films 122 cover only the surface of the interlayer insulating film 111.

The titanium film 123 covers the nickel silicide films 121 and the titanium nitride films 122. The aluminum film 124 is embedded in contact holes of the interlayer insulating film 111 and is electrically connected to the $n^+$-type source regions 105 and the $p^{++}$-type contact regions 106, via the titanium film 123 and the nickel silicide films 121. Reference numerals 101, 102, 104, 108, 113, and 114 are an $n^+$-type drain region, an $n^-$-type drift region, a p-type base region, gate insulating films, $p^+$-type regions, and a drain electrode of the MOSFET, respectively.

The trench-type SBDs 130 have the Schottky trenches 131 and the conductive films 132 embedded in the Schottky trenches 131. The trench-type SBDs 130 are diodes that use rectification of Schottky barriers formed at both sidewalls of the Schottky trenches 131, at junction interfaces 133 (two locations surrounded by two-dot chain lined circles) between an n-type current spreading region 103 and the conductive films 132. The conductive films 132 are each a single-layer titanium film in contact with and electrically connected to the titanium film 123 and the aluminum film 124 that configure the source electrode 112.

A conventional trench gate type MOSFET that has a built-in SBD has been proposed that includes a metal layer in Schottky contact with a drift region at sidewalls of Schottky trenches provided between adjacent gate trenches, and a source electrode embedded in Schottky trenches (for example, refer to Japanese Laid-Open Patent Publication No. 2020-077664). In Japanese Laid-Open Patent Publication No. 2020-077664, a material of the metal layer in Schottky contact with the drift region is disclosed to be titanium, nickel, gold, tungsten, platinum, chromium, or the like and a material of the source electrode is disclosed to be aluminum.

SUMMARY OF THE INVENTION

According to an embodiment of the present invention, a silicon carbide semiconductor device includes: a semiconductor substrate containing silicon carbide, the semiconductor substrate having a first main surface and a second main surface that are opposite to each other; a first semiconductor region of a first conductivity type, provided in the semiconductor substrate; a second semiconductor region of a second conductivity type, provided in the semiconductor substrate and between the first main surface of the semiconductor substrate and the first semiconductor region; a plurality of third semiconductor regions of the first conductivity type, selectively provided in the semiconductor substrate and between the first main surface of the semiconductor substrate and the second semiconductor region; a plurality of trenches penetrating through the plurality of third semiconductor regions and the second semiconductor region and reaching the first semiconductor region, the plurality of trenches including a plurality of first trenches and a plurality of second trenches different from the plurality of first trenches; a plurality of gate electrodes respectively provided in the plurality of first trenches, via a plurality of gate insulating films; a plurality of conductive films respectively embedded in the plurality of second trenches, each of the plurality of conductive films being configured by a plurality of stacked metal films made of materials different from one another, junction interfaces between the first semiconductor region and the plurality of conductive films forming a plurality of Schottky barriers; a first electrode electrically connected to the second semiconductor region, the plurality of third semiconductor regions, and the plurality of conductive films; a second electrode provided at the second main surface of the semiconductor substrate; and a plurality of Schottky barrier diodes that respectively include the plurality of Schottky barriers. Each of the plurality of conductive films has: a first metal film provided along an inner wall of a respective one of the plurality of second trenches, the first metal film being in Schottky contact with the first semiconductor region, at the inner wall of the respective one of the plurality of second trenches, and a second metal film provided closer to a center of the respective one of the plurality of second trenches than is the first metal film, the second metal film having an electrical resistivity that is lower than an electrical resistivity of the first metal film. The first metal film is a nickel film, and the second metal film is a tungsten film.

Objects, features, and advantages of the present invention are specifically set forth in or will become apparent from the following detailed description of the invention when read in conjunction with the accompanying drawings.

DETAILED DESCRIPTION OF THE INVENTION

Figure 9:
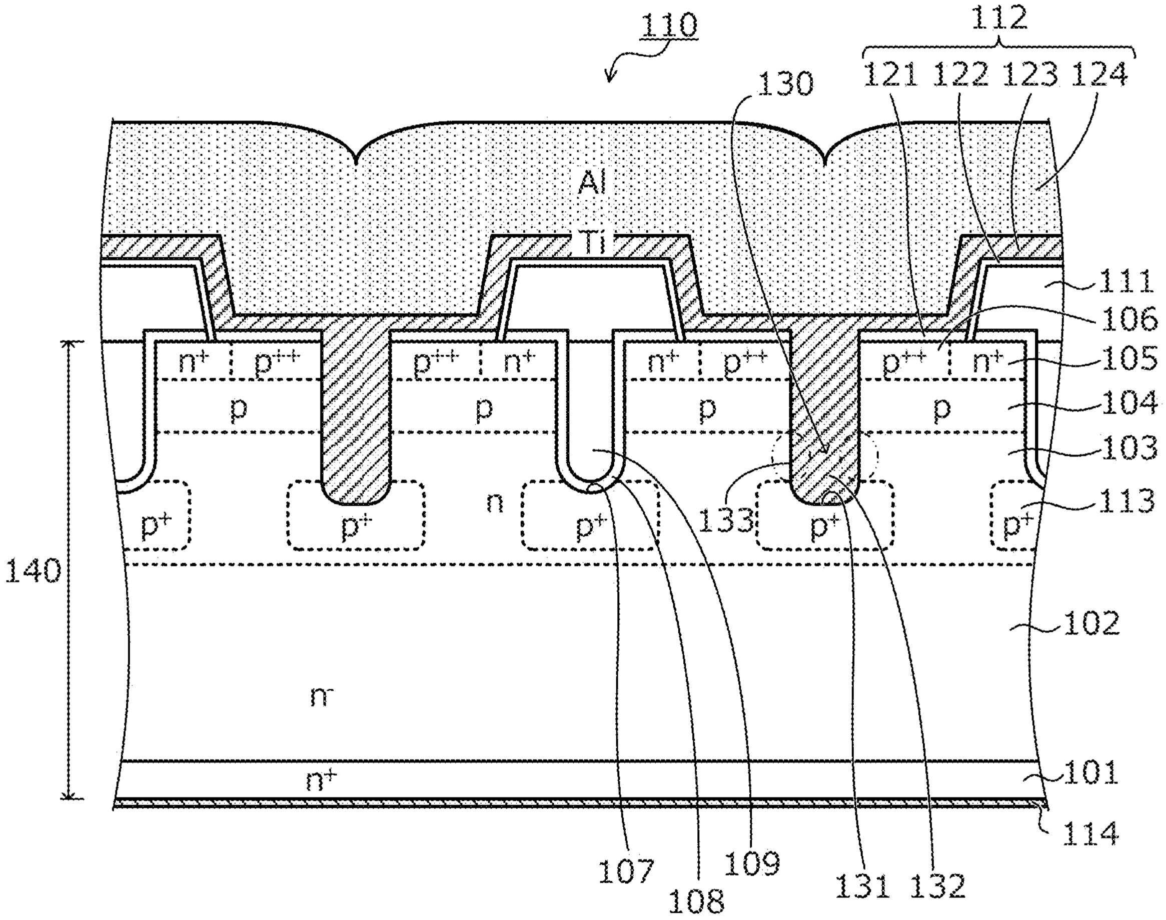
FIG.9 RELATED ART
FIG. 9 is a cross-sectional view depicting a structure of the conventional silicon carbide semiconductor device.

First, problems associated with the conventional techniques are discussed. In the conventional silicon carbide semiconductor device 110 (refer to FIG. 9), a single metal such as titanium or nickel of a low Schottky barrier effect is used as material of the conductive films 132 embedded in the Schottky trenches 131, whereby operation of the trench-type SBDs 130 is facilitated and degradation of forward characteristics of the parasitic diodes of the MOSFET is suppressed. Nonetheless, resistance of titanium and nickel is high as compared to a typical material of a MOSFET electrode such as aluminum (Al). Current paths of the trench-type SBDs 130 are long in a depth direction due to the Schottky trenches 131, whereby the trench-type SBDs 130 may have a high resistance.

Further, it has been confirmed that when titanium or nickel of a low Schottky barrier effect is used as a material of the conductive films 132 embedded in the Schottky trenches 131, short-circuit withstand capability of the MOSFET decreases. On the other hand, to increase the short-circuit withstand capability of the MOSFET, when a metal other than titanium or nickel is used for a material of the conductive films 132, Schottky characteristics of the trench-type SBDs 130 decrease. Thus, the suppression of the degradation of forward characteristics of the parasitic diodes of the MOSFET, enhancement of the short-circuit withstand capability of the MOSFET, and reduction of the resistance of the trench-type SBDs 130 are difficult to achieve concurrently.

Embodiments of a silicon carbide semiconductor device and method of manufacturing a silicon carbide semiconductor device according to the present invention are described in detail with reference to the accompanying drawings.

In the present description and accompanying drawings, layers and regions prefixed with n or p mean that majority carriers are electrons or holes.

Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 1:
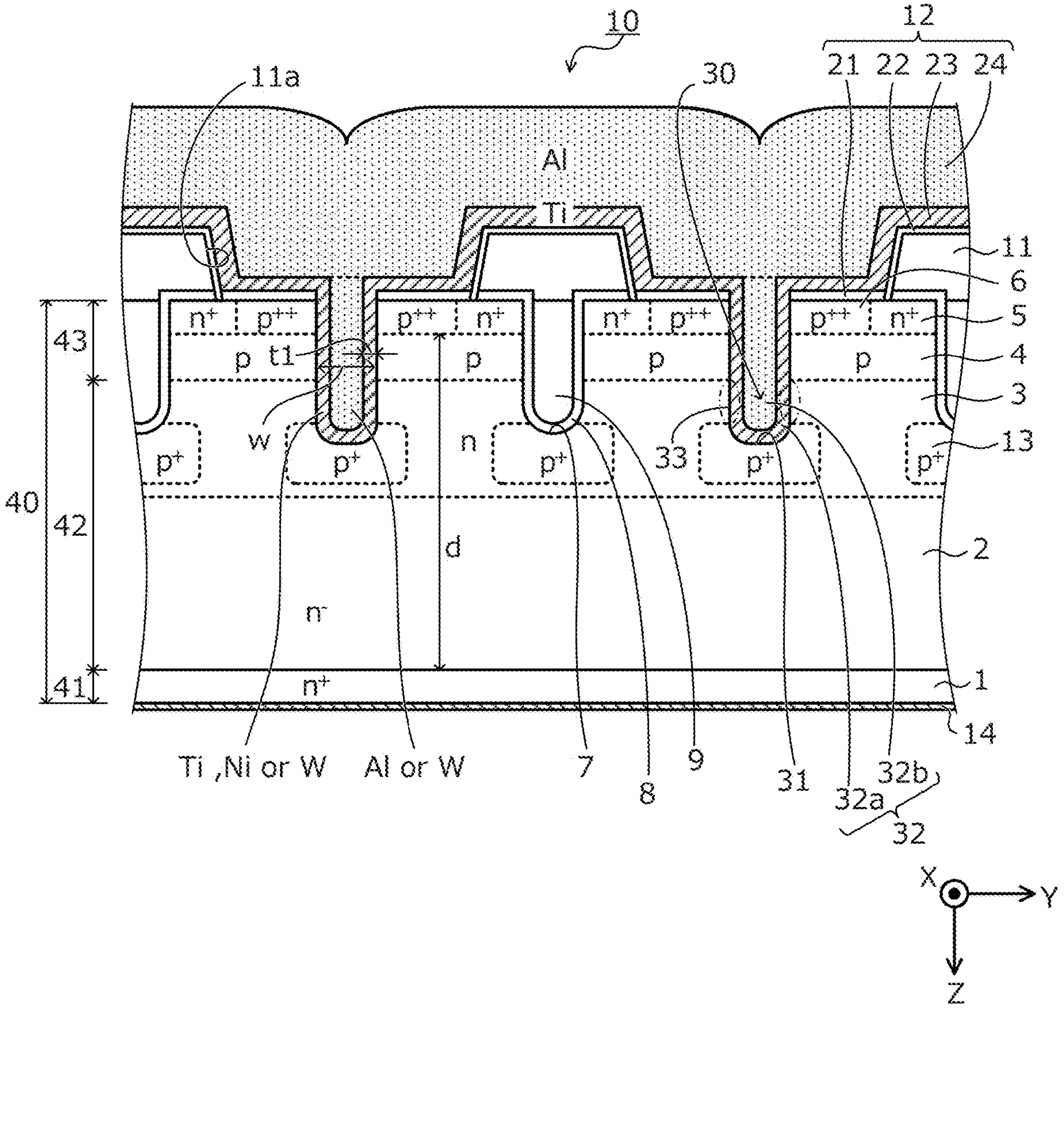
FIG. 1 is a cross-sectional view depicting a structure of a silicon carbide semiconductor device according to a first embodiment.
Figure 2:
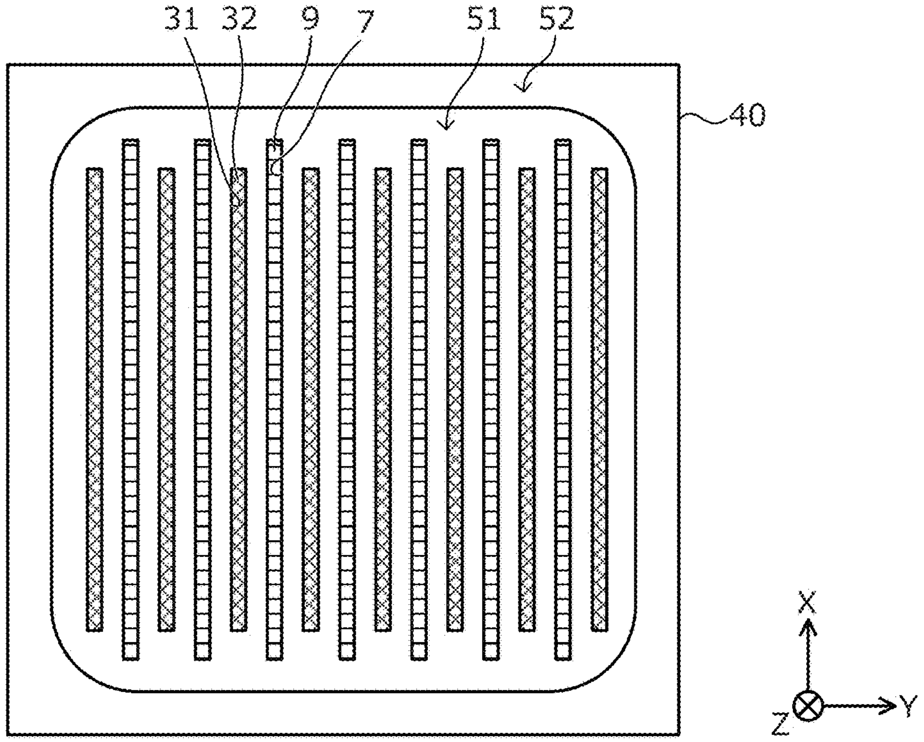
FIG. 2 is a plan view depicting a layout when the silicon carbide semiconductor device according to the first embodiment is viewed from a front side of a semiconductor substrate thereof.
Figure 3:
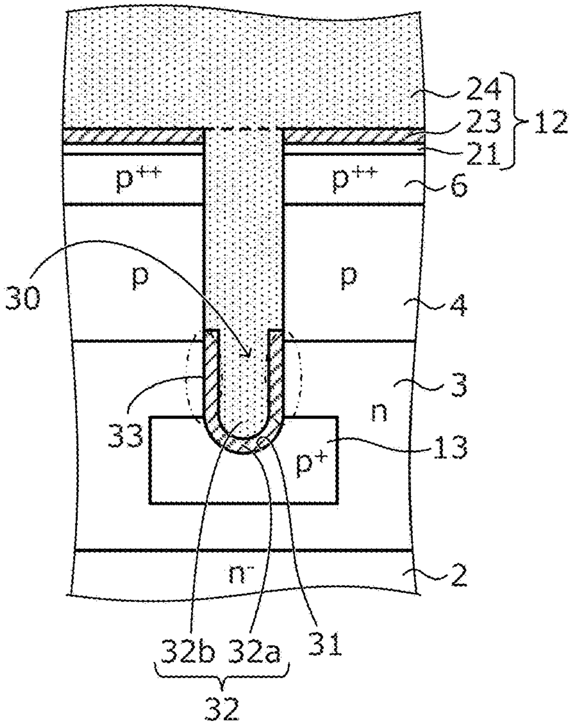
FIG. 3 is a cross-sectional view of another example of a trench-type SBD in FIG. 1.
Figure 4:
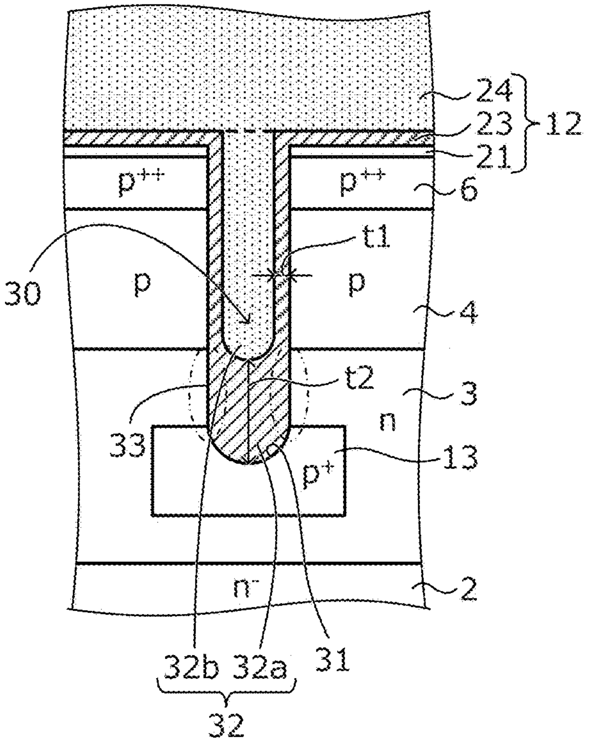
FIG. 4 is a cross-sectional view of another example of the trench-type SBD in FIG. 1.

A structure of a silicon carbide (SiC) semiconductor device according to a first embodiment is described. FIG. 1 is a cross-sectional view depicting the structure of the silicon carbide semiconductor device according to the first embodiment. In FIG. 1, a state of an active region 51 in FIG. 2 is depicted. FIG. 2 is a plan view depicting a layout when the silicon carbide semiconductor device according to the first embodiment is viewed from a front side of a semiconductor substrate thereof. FIG. 2 depicts a layout of gate trenches 7 and Schottky trenches 31. In FIG. 2, gate insulating films 8 are not depicted. FIGS. 3 and 4 are cross-sectional views of other examples of the trench-type SBD in FIG. 1.

A silicon carbide semiconductor device 10 according to the first embodiment depicted in FIGS. 1 and 2 is a vertical MOSFET having a trench gate structure in which trench-type SBDs 30 are built into a single semiconductor substrate (semiconductor chip) 40 containing silicon carbide. In the active region 51, trenches (gate trenches: first trenches) 7 in which gate electrodes 9 configuring the trench gate structure of the MOSFET are embedded and trenches (Schottky trenches: second trenches) 31 in which trench-type SBDs 30 are embedded are provided in the front side of the semiconductor substrate 40.

The active region 51 is a region through which a main current (drift current) flows when the MOSFET is in an on-state and in which multiple unit cells (functional units of the device) of the MOSFET are disposed adjacently to one another. In FIG. 1, a portion of the multiple unit cells of the active region 51 are depicted. An edge termination region 52 is a region between the active region 51 and an end (chip end) of the semiconductor substrate 40; the edge termination region 52 surrounds a periphery of the active region 51, mitigates electric field of the front side of the semiconductor substrate 40, and sustains a breakdown voltage. The breakdown voltage is a voltage limit at which no malfunction or damage of the silicon carbide semiconductor device 10 occurs.

In the edge termination region 52, a voltage withstanding structure such as a field limiting ring (FLR), junction termination extension (JTE) structure, etc. is disposed. The trench-type SBDs 30 have a function of preventing degradation of forward characteristics of parasitic diodes (body diodes) formed by pn junctions between $p^{++}$-type contact regions 6, a p-type base region (second semiconductor region) 4 and the $p^{+}$-type regions 13, and an n-type current spreading region 3, an $n^-$-type drift region (first semiconductor region) 2 and an $n^+$-type drain region 1.

The semiconductor substrate 40 is formed by sequentially forming silicon carbide layers (first semiconductor region) 42, (second semiconductor region) 43 constituting the $n^-$-type drift region 2 and the p-type base region 4 by epitaxial growth on a front surface of the $n^+$-type starting substrate 41. The semiconductor substrate 40 has, as a front surface, a main surface having the p-type silicon carbide layer 43 and as a back surface, a main surface having the $n^+$-type starting substrate 41. In the front side of the semiconductor substrate 40, MOS gates of the trench gate structure are provided. The MOS gates are configured by the p-type base region 4, $n^+$-type source regions (third semiconductor regions) 5, the $p^{++}$-type contact regions 6, the gate trenches 7, the gate insulating films 8, and the gate electrodes 9.

The $n^+$-type starting substrate 41 constitutes the $n^+$-type drain region 1. The $n^-$-type drift region 2 is a portion of the $n^-$-type silicon carbide layer 42, excluding the later-described $p^+$-type regions 13 and the later-described n-type current spreading region 3, and is provided between and in contact with the $p^+$-type regions 13, the n-type current spreading region 3 and the $n^+$-type starting substrate 41. The p-type base region 4 is a portion of the p-type silicon carbide layer 43, excluding the later-described $n^+$-type source regions 5 and the later-described $p^{++}$-type contact regions 6, and is provided between the front surface of the semiconductor substrate 40 and the $n^-$-type drift region 2.

The $n^+$-type source regions 5 and the $p^{++}$-type contact regions 6 are each selectively provided between the front surface of the semiconductor substrate 40 and the p-type base region 4. The $n^+$-type source regions 5 and the $p^{++}$-type contact regions 6 are in contact with the p-type base region 4 and exposed at the front surface of the semiconductor substrate 40. The $p^{++}$-type contact regions 6 may be omitted. In an instance in which the $p^{++}$-type contact regions 6 are omitted, instead of the $p^{++}$-type contact regions 6, the p-type base region 4 is exposed at the front surface of the semiconductor substrate 40.

Between the $n^-$-type drift region 2 and the p-type base region 4, the n-type current spreading region 3 is provided in contact with the $n^-$-type drift region 2 and the p-type base region 4. The n-type current spreading region 3 is a so-called current spreading layer (CSL) that reduces carrier spreading resistance. The n-type current spreading region 3 is adjacent to the gate trenches 7 and the later-described Schottky trenches 31 in a direction that is parallel to the front surface of the semiconductor substrate 40 and reaches a position closer to the $n^+$-type drain region 1 than are bottoms of the gate trenches 7 and the later-described Schottky trenches 31.

The $p^+$-type regions 13 are provided apart from the p-type base region 4, at positions closer to the $n^+$-type drain region 1 than are the bottoms of the gate trenches 7. The $p^+$-type regions 13 face, respectively, the bottoms of the gate trenches 7 in a depth direction. The $p^+$-type regions 13 may be exposed at the bottoms of the gate trenches 7. Being exposed at the bottoms of the gate trenches 7 means being provided so as to surround peripheries of the bottoms of the gate trenches 7, at positions facing the bottoms of the gate trenches 7 and being in contact with the gate insulating films 8, at the bottoms of the gate trenches 7.

As described above, the $p^+$-type regions 13 suffice to reach positions closer to the $n^+$-type drain region 1 than are the bottoms of the gate trenches 7 and the depth of the $p^+$-type regions 13 may be variously changed. For example, the $p^+$-type regions 13 may reach positions closer to the $n^+$-type drain region 1 than is the n-type current spreading region 3 (refer to FIG. 1), or may terminate at a same depth as that of the n-type current spreading region 3 relative to the $n^+$-type drain region 1 (not depicted) so as to be in contact with the $n^-$-type drift region 2 or may terminate at a position further from the $n^+$-type drain region 1 than is the n-type current spreading region 3, or peripheries of the $p^+$-type regions 13 may be surrounded by the n-type current spreading region 3 (not depicted).

The $p^+$-type regions 13 are electrically connected to a source electrode (first electrode) 12 by a non-depicted portion and have a function of depleting when the MOSFET is off to thereby mitigate electric field applied to the bottoms of the gate trenches 7. The n-type current spreading region 3 may be omitted. In an instance in which the n-type current spreading region 3 is omitted, the p-type base region 4 and the $n^-$-type drift region 2 are in contact with each other. The peripheries of the $p^+$-type regions 13 are surrounded by the $n^-$-type drift region 2. Additionally, in the description hereinafter, the n-type current spreading region 3 suffices to be read interchanged with the $n^-$-type drift region 2.

The gate trenches 7 penetrate through the $n^+$-type source regions 5 and the p-type base region 4 in the depth direction and reach the n-type current spreading region 3. The gate trenches 7, for example, extend in a striped pattern in a first direction X that is parallel to the front surface of the semiconductor substrate 40. Between the gate trenches 7 that are adjacent to one another, the p-type base region 4, the $n^+$-type source regions 5, the $p^{++}$-type contact regions 6, and the $p^+$-type regions 13 extend linearly in the first direction X, parallel to the gate trenches 7. The $p^{++}$-type contact regions 6 may be scattered in the first direction X, parallel to the gate trenches 7.

The gate electrodes 9 are provided in the gate trenches 7, via the gate insulating films 8, respectively. One unit cell of the trench gate type MOSFET spans between centers of any adjacent two of the gate trenches 7. Each of the Schottky trenches 31 is provided between a respective adjacent two of the gate trenches 7 and penetrates in the depth direction, a respective one of the $p^{++}$-type contact regions 6 and the p-type base region 4 and reaches the n-type current spreading region 3. The Schottky trenches 31, for example, extend in the first direction X, parallel to the gate trenches 7 and have a length that is shorter than that of the gate trenches 7.

The Schottky trenches 31 and the gate trenches 7 are disposed so as to repeatedly alternate one another in a second direction Y, which is parallel to the front surface of the semiconductor substrate 40 and orthogonal to the first direction X. Similarly to the $p^+$-type regions 13 near the bottoms of the gate trenches 7, the $p^+$-type regions 13 are selectively provided at positions that face bottoms of the Schottky trenches 31 in the depth direction, respectively, and in addition to this, are exposed at the bottoms of the Schottky trenches 31. Being exposed at the bottoms of the Schottky trenches 31 means surrounding peripheries of the bottoms of the Schottky trenches 31 and being in contact with later-described conductive films 32 at the bottoms of the Schottky trenches 31.

One of the Schottky trenches 31 and one of the conductive films 32 configure one unit cell of the trench-type SBDs 30, said one of the conductive films 32 being embedded in said one the Schottky trenches 31. The trench-type SBDs 30 are diodes that use rectification of Schottky barriers formed at junction interfaces 33 (two locations surrounded by two-dot chain lined circles) between the n-type current spreading region 3 and the conductive films 32, at sidewalls of the Schottky trenches 31. The trench-type SBDs 30 extend along both sidewalls of each of the Schottky trenches 31 in the first direction X. The Schottky trenches 31 may be completely embedded with the conductive films 32.

The conductive films 32 are configured by multiple metal films, each of a different material, embedded in each of the Schottky trenches 31. In other words, the metals films configuring the conductive films 32 form a layered shape in the Schottky trenches 31. The combination of metal films configuring the conductive films 32 may be variously changed according to purpose (desired operational effect). For example, the combination of the metal films configuring the conductive films 32 is set based on parameters such as the size, electrical resistivity, melting point, etc. of the Schottky barrier with respect to silicon carbide.

By the combination of metal films configuring the conductive films 32, suppression (inactivation of the parasitic diodes) of the degradation of forward characteristics of the parasitic diodes of the MOSFET or enhancement of short-circuit (short-circuit between the source and gate) capability of the MOSFET or both are realized and resistance (static characteristics improvement of the trench-type SBDs 30) of the trench-type SBDs 30 may be reduced. To suppress degradation of forward characteristics of the parasitic diodes of the MOSFET, a metal material having a Schottky barrier effect that is relatively small with respect to silicon carbide in terms of metals in general may be preferably used for later-described first metal films 32*a*.

To enhance the short-circuit withstand capability of the MOSFET, a metal material having a Schottky barrier effect that is relatively large with respect to silicon carbide in terms of metals in general may be used for the first metal films 32*a*, or a metal material that does not melt due to generated heat of the semiconductor substrate 40 during short-circuit of the MOSFET may be used for later-described second metal films 32*b*, or both of these metal materials may be used for the first and second metals films 32*a*, 32*b*, respectively. To reduce the resistance of the trench-type SBDs 30, a metal material having an electrical resistivity that is lower than that of the first metal films 32*a* may be used for the later-described second metal films 32*b*.

In particular, the conductive films 32 have, at the sidewalls of the Schottky trenches 31, the first metal films 32*a* that are in contact with the n-type current spreading region 3 (in an instance in which the n-type current spreading region 3 is omitted, the $n^-$-type drift region 2) and form Schottky barriers in a range of, for example, about 1.1 eV to 1.5 eV, at the junction interfaces 33 with the n-type current spreading region 3, and the second metal films 32*b* that have an electrical resistivity that is lower than that of the first metal films 32*a*. The first and second metal films 32*a*, 32*b* may have Schottky barrier effects that are of substantially a same degree with respect to silicon carbide.

The first metal films 32*a* are provided along the sidewalls of the Schottky trenches 31 and are in Schottky contact with the n-type current spreading region 3. Portions of the first metal films 32*a* at the sidewalls of the Schottky trenches 31 have a thickness t1 that preferably may be as thin as possible to an extent that predetermined Schottky characteristics are obtained and may be formed to have a substantially uniform thickness. The thickness t1 of the first metal films 32*a* is substantially uniform, whereby variation of Schottky characteristics of the trench-type SBDs 30 may be suppressed. The thickness being substantially uniform means the same thickness within a range that includes allowable error due to process variation.

The thinner is the thickness t1 of the portions of the first metal films 32*a*, at the sidewalls of the Schottky trenches 31, the greater the electrical resistivity of the conductive films 32 may be reduced. A width w of the Schottky trenches 31 in the second direction Y is, for example, in a range of about 0.1 μm to 0.4 μm; and at least the thickness t1 of the portions of the first metal films 32*a*, at the sidewalls of the Schottky trenches 31 may be thin in a range of, for example, about 100 nm to 200 nm. Portions of the first metal films 32*a*, at the bottoms of the Schottky trenches 31 may have a thickness t2 that is wider than the thickness t1 of the portions at the sidewalls (FIG. 4).

The first metal films 32*a* may be provided in an entire area of inner walls (the sidewalls and the bottoms) of the Schottky trenches 31 (FIG. 1), may be provided only at the sidewalls of the Schottky trenches 31, or may be omitted at the bottoms of the Schottky trenches 31 (not depicted). The first metal films 32*a* suffice to be at least in contact with the n-type current spreading region 3 at the sidewalls of the Schottky trenches 31 and portions at the inner walls of the Schottky trenches 31, for example, may be provided only from pn junction interfaces between the p-type base region 4 and the n-type current spreading region 3 to the bottoms of the Schottky trenches 31 (FIG. 3).

The trench-type SBDs 30 in FIG. 4 may be applied to the trench-type SBDs 30 in FIG. 3 and, from the pn junction interfaces between the p-type base region 4 and the n-type current spreading region 3 to the bottoms of the Schottky trenches 31, the first metal films 32*a* may be provided at the sidewalls and the bottoms of the Schottky trenches 31, and the thickness t2 of the portions at the bottoms of the Schottky trenches 31 may be thicker than the thickness t1 of the portions at the sidewalls. In this instance, the second metal films 32*b* are in contact with silicon carbide portions (regions exposed at the inner walls of the Schottky trenches 31) at the opening sides and the bottoms of the Schottky trenches 31.

The second metal films 32*b* are embedded in the Schottky trenches 31, on the first metal films 32*a*, respectively. The second metal films 32*b* are embedded closer to substantially a center (center in the first and second directions X, Y) of the Schottky trenches 31 as compared to the first metal films 32*a* and extend linearly in the Schottky trenches 31 in the depth direction. In an instance in which the first metal films 32*a* are provided in an entire area of the surface of the inner walls of the Schottky trenches 31, the peripheries of the second metal films 32*b* are entirely surrounded by the first metal films 32*a* and are not in contact with the silicon carbide portions.

The shorter is the length of the second metal films 32*b* in the depth direction, the smaller is an effect of reducing the resistance of the trench-type SBDs 30, nonetheless, configuration may be such that the second metal films 32*b* do not reach a vicinity of the bottoms of the Schottky trenches 31. FIG. 4 depicts an instance in which the second metal films 32*b* terminate near the pn junctions between the p-type base region 4 and the n-type current spreading region 3 in the depth direction. In this manner, the conductive films 32 in which the first and second metal films 32*a*, 32*b* are sequentially stacked are embedded in the Schottky trenches 31, respectively. The conductive films 32 are electrically connected to the later-described source electrode 12.

Aluminum (Al), titanium (Ti) and nickel (Ni), which are general electrode materials (materials of the source electrode 12 and later-described drain electrode (second electrode) 14) of the MOSFET, and tungsten (W), which is a material of a wiring member may be used in various combinations as a material of the first and second metal films 32*a*, 32*b*. Titanium and aluminum have substantially a same Schottky barrier effect with respect to silicon carbide. Nickel and tungsten have a larger Schottky barrier effect with respect to silicon carbide than that of titanium and aluminum.

Aluminum and tungsten have a lower electrical resistivity than that of titanium and nickel. Aluminum has a melting point that is extremely low as compared to that of titanium, nickel, and tungsten. Tungsten has a melting point that is higher than that of titanium and nickel. When the magnitude (size) of physical properties between these metals is expressed by elemental symbols of the metals and inequality signs, Schottky barrier effect with respect to silicon carbide is $Al \approx Ti < W < Ni$; the electrical resistivity is $Al < W < Ni < Ti$; and the melting point is $Al \ll Ni < Ti < W$.

In this instance, the first metal films 32*a* are each a titanium film, a nickel film, or a tungsten film. The second metal films 32*b* are an aluminum film or a tungsten film. The titanium film and the nickel film, for example, are formed by a sputtering method. The aluminum film, for example, is formed by a reflow sputtering method in which the aluminum film is softened by a heat treatment (reflow) while being deposited by a sputtering method and is thereby embedded in the trenches. The tungsten film is formed by, for example, chemical vapor deposition (CVD).

Degradation of forward characteristics of the parasitic diodes of the MOSFET is suppressed by the Schottky barriers formed by the first metal films 32*a* (titanium film, nickel film, or tungsten film). In an instance in which the first metal films 32*a* are a titanium film, the first metal films 32*a* may be formed concurrently with titanium films 23 of the source electrode 12. In an instance in which the first metal films 32*a* are a nickel film or a tungsten film, the Schottky barrier is large as compared to a titanium film and thus, the short-circuit withstand capability of the MOSFET is enhanced.

Conductivity of the trench-type SBDs 30 is improved by the second metal films 32*b* (aluminum films or tungsten films), which have electrical resistivity that is lower than that of the first metal films 32*a*. In an instance in which the second metal films 32*b* are a tungsten film, the second metal films 32*b* do not melt due to heat (for example, temperature of about 800 degrees or more) generated by the semiconductor substrate 40 such as when the MOSFET short-circuits. Therefore, the short-circuit withstand capability of the MOSFET is enhanced. Even in an instance in which the second metal films 32*b* are an aluminum film, the second metal films 32*b* may be preferably formed by, for example, the reflow sputtering method, which has high embeddability with respect to the Schottky trenches 31, instead of being formed concurrently with an aluminum film 24 of the source electrode 12.

An interlayer insulating film 11 is provided in an entire area of the front surface of the semiconductor substrate 40 and covers the gate electrodes 9. Contact holes 11*a* that penetrate through the interlayer insulating film 11 in the depth direction and reach the semiconductor substrate 40 are provided, respectively, between the gate trenches 7 that are adjacent to one another. In the contact holes 11*a*, the $n^+$-type source regions 5, the $p^{++}$-type contact regions 6, and the conductive films 32 (at least the second metal films 32*b*) are exposed. The source electrode 12 is provided spanning the surface of the interlayer insulating film 11, from the front surface of the semiconductor substrate 40, in the contact holes 11*a*.

The source electrode 12 is configured by nickel silicide ($Ni_xSi_y$, where, x, y are positive numbers) films 21, titanium nitride (TiN) films 22, the titanium films 23, and the aluminum film 24 provided at the front surface of the semiconductor substrate 40. The nickel silicide films 21 are provided on the front surface of the semiconductor substrate 40, in the contact holes 11*a*, and are in ohmic contact with the $n^+$-type source regions 5 and the $p^{++}$-type contact regions 6. The titanium nitride films 22 are provided on an entire area of the surface of the interlayer insulating film 11 and cover only the surface of the interlayer insulating film 11.

Each of the titanium films 23 is provided along the surface of the interlayer insulating film 11, from above the front surface of the semiconductor substrate 40 in a respective one of the contact holes 11*a* and covers a respective one of the nickel silicide films 21 and a respective one of the titanium nitride films 22. The aluminum film 24 is provided on the titanium films 23 and the conductive films 32 so as to be embedded in the contact holes 11*a*. The aluminum film 24 is electrically connected to the $n^+$-type source regions 5 and the $p^{++}$-type contact regions 6, via the nickel silicide films 21, the titanium nitride films 22, and the titanium films 23.

The aluminum film 24 is in contact with the conductive films 32 (the second metal films 32*b*, or both the first and second metal films 32*a*, 32*b*) of the trench-type SBDs 30 and is electrically connected to the conductive films 32 (the first and second metal films 32*a*, 32*b*). Instead of the aluminum film 24, for example, an aluminum alloy film such as an aluminum-silicon (Al—Si) film may be provided. On the back surface (back surface of the $n^+$-type starting substrate 41) of the semiconductor substrate 40, the drain electrode 14 is provided in ohmic contact with the back surface of the semiconductor substrate 40.

Figure 5:
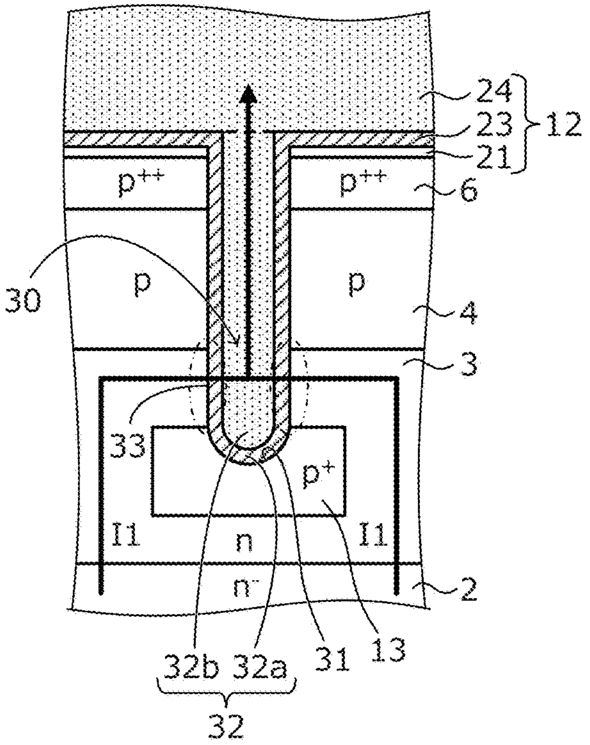
FIG. 5 is a diagram depicting operation during reverse recover of the trench-type SBD in FIG. 1.
Figure 6:
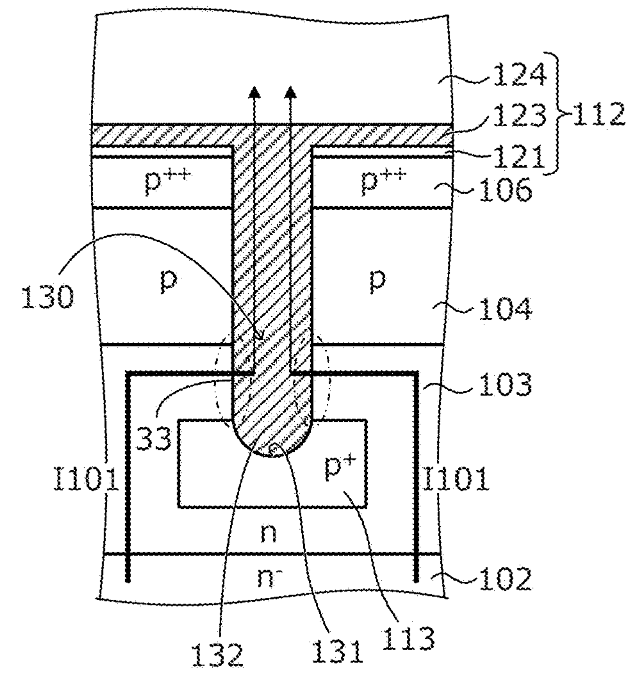
FIG. 6 is a diagram depicting operation during reverse recovery of a trench-type SBD of a conventional silicon carbide semiconductor device 110 in FIG. 9.

Next, operation of the silicon carbide semiconductor device 10 according to the first embodiment is described. FIG. 5 is a diagram depicting operation during reverse recover of the trench-type SBD in FIG. 1. FIG. 6 is a diagram depicting operation during reverse recovery of the trench-type SBD of the conventional silicon carbide semiconductor device 110 in FIG. 9. FIG. 5 depicts a vicinity of the trench-type SBDs 30 in FIG. 1. While not depicted, in the trench-type SBDs 30 of the other examples in FIGS. 3 and 4 as well, operation is similar to that of the trench-type SBDs 30 in FIG. 5. FIG. 6 depicts a vicinity of the trench-type SBDs 130 in FIG. 9.

As depicted in FIG. 5, in the silicon carbide semiconductor device 10 according to the first embodiment, when parasitic diodes formed by pn junctions between the $p^{++}$-type contact regions 6, the p-type base region 4 and the $p^+$-type regions 13, and the n-type current spreading region 3, the $n^-$-type drift region 2 and the $n^+$-type drain region 1 of the MOSFET are forward biased, due to the Schottky barriers, which are determined by the electrical properties of the first metal films 32*a* of the conductive films 32, the trench-type SBDs 30 for which forward voltage is set lower than that of the parasitic pn diodes conduct sooner than the parasitic pn diodes (not depicted).

Accordingly, vertical parasitic npn bipolar transistors (body diodes) formed by the n-type current spreading region 3, the p-type base region 4, and the $n^+$-type source regions 5 in the semiconductor substrate 40 do not operate. As a result, due to the first metal films 32*a* of the conductive films 32, degradation of forward characteristics of the parasitic diodes of the MOSFET is suppressed and reverse recovery loss may be reduced. Further, in an instance in which the first metal films 32*a* of the conductive films 32 are a nickel film or a tungsten film, the short-circuit withstand capability of the MOSFET may be further enhanced.

On the other hand, during reverse bias of the parasitic pn diodes of the MOSFET (during reverse recovery), the trench-type SBDs 30 are also in reverse recovery. During reverse recovery, a reverse recovery current 11 that flows in a direction from the drain electrode 14 of the MOSFET to the source electrode 12 (reverse direction) and passes through the $n^+$-type drain region 1, the $n^-$-type drift region 2, and the n-type current spreading region 3, flows to the source electrode 12 via the second metal films 32*b* that have a relatively lower electrical resistivity of the first and second metal films 32*a*, 32*b* of the conductive films 32 of the trench-type SBDs 30, which have a shorter reverse recovery time than that of the parasitic pn diodes.

During reverse recovery of the parasitic pn diodes of such a MOSFET as this, for example, in the conventional structure depicted in FIG. 6, the conductive films 132 embedded in the Schottky trenches 131 of the trench-type SBDs 130 are configured by single metals, whereby the reverse recovery current 1101 flows from the n-type current spreading region 103 to the source electrode 112, via the conductive films 132 (single-layer titanium film or single-layer nickel film) of the trench-type SBDs 130; the conductive films 132 have high electrical resistivity. Thus, the amount of the reverse recovery current 11 diminishes and the resistance of the trench-type SBDs 130 increases.

In contrast, in the first embodiment, the reverse recovery current 11 passes through the first metal films 32*a* provided along the sidewalls of the Schottky trenches 31 in a direction of the thickness t1, and flows through the second metal films 32*b*, which have a lower electrical resistivity than that of the first metal films 32*a* and are provided closer to the centers of the Schottky trenches 31 than are the first metal films 32*a*. Thus, maintenance of the amount of the reverse recovery current 11 is facilitated and the thinner is the thickness of the first metal films 32*a*, the lower is the resistance of the trench-type SBDs 30. Further, in an instance in which the second metal films 32*b* are a tungsten film, during short-circuit of the MOSFET, the second metal films 32*b* are resistant to melting and thus, the short-circuit withstand capability of the MOSFET may be further enhanced.

Next, method of manufacturing the silicon carbide semiconductor device 10 according to the first embodiment is described. First, the $n^+$-type starting substrate (semiconductor wafer) 41 containing silicon carbide is prepared. The $n^+$-type starting substrate 41 constitutes the $n^+$-type drain region 1. Next, the $n^-$-type silicon carbide layer 42 is epitaxially grown on the front surface of the $n^+$-type starting substrate 41 and has a thickness that is thinner than a product thickness d of the $n^-$-type silicon carbide layer 42 after completion of manufacturing. Next, by photolithography and ion-implantation of a p-type impurity, the $p^+$-type regions 13 are selectively formed in the $n^-$-type silicon carbide layer 42, at the surface thereof.

Next, a mask (not depicted) used in the formation of the $p^+$-type regions 13 is removed and thereafter, by photolithography and ion-implantation of an n-type impurity, for example, in an entire area of the active region, the n-type current spreading region 3 is formed in the $n^-$-type silicon carbide layer 42, at the surface thereof. A sequence in which the n-type current spreading region 3 and the $p^+$-type regions 13 are formed may be interchanged. Ion implantation masks used in the formation of the n-type current spreading region 3 and the $p^+$-type regions 13 or diffused regions formed by later-described ion implantations may be, for example, an oxide film ($SiO_2$ film) or may be a resist film.

In the $n^-$-type silicon carbide layer 42, a portion thereof left free of ion implantation between the n-type current spreading region 3, the $p^+$-type regions 13, and the $n^+$-type starting substrate 41 constitutes the $n^-$-type drift region 2. Next, a mask (not depicted) used in the formation of the n-type current spreading region 3 is removed and thereafter, an $n^-$-type silicon carbide layer is further epitaxially grown on the $n^-$-type silicon carbide layer 42, thereby increasing the thickness of the $n^-$-type silicon carbide layer 42 so that the $n^-$-type silicon carbide layer 42 has the product thickness d. An impurity concentration of the portion by which the thickness of the $n^-$-type silicon carbide layer 42 is increased, for example, may be substantially equal to an impurity concentration of the $n^-$-type drift region 2.

Next, by photolithography and ion-implantation of a p-type impurity, the p-type impurity is selectively introduced in the portion by which the thickness of the $n^-$-type silicon carbide layer 42 is increased, whereby a thickness of the $p^+$-type regions 13 is increased. Next, a mask (not depicted) used in the formation of the $p^+$-type regions 13 is removed and thereafter, by photolithography and ion-implantation of an n-type impurity, in an entire area of the active region, the n-type impurity is introduced in the portion by which the thickness of the $n^-$-type silicon carbide layer 42 is increased, whereby a thickness of the n-type current spreading region 3 is increased. A sequence in which the n-type current spreading region 3 and the $p^+$-type regions 13 are formed may be interchanged.

Next, the p-type silicon carbide layer 43 is epitaxially grown on the surface of the $n^-$-type silicon carbide layer 42. As a result, the semiconductor substrate 40 in which the silicon carbide layers 42, 43 are sequentially grown on the front surface of the $n^+$-type starting substrate 41 is completed. Next, by photolithography and etching, a portion of the p-type silicon carbide layer 43 in the edge termination region 52 is removed, leaving the p-type silicon carbide layer 43 only in the active region 51. In the edge termination region 52, the $n^-$-type silicon carbide layer 42 is expose at the front surface of the semiconductor substrate 40.

Next, an etching mask (not depicted) used to partially remove the p-type silicon carbide layer 43 is removed. Next, photolithography, ion implantation of an impurity, and removal of the ion implantation mask (not depicted) are repeatedly performed as one set under different conditions, thereby selectively forming the $n^+$-type source regions 5 and the $p^{++}$-type contact regions 6 in the p-type silicon carbide layer 43, at the surface thereof, in the active region 51, and forming $p^-$-type regions (not depicted) that configure the voltage withstanding structure, the $p^-$-type regions being formed in the $n^-$-type silicon carbide layer 42, at the surface thereof, in the edge termination region 52.

Next, by photolithography and etching, the gate trenches 7 that penetrate through the $n^+$-type source regions 5 and the p-type base region 4 and reach the n-type current spreading region 3 are formed at positions facing the $p^+$-type regions 13 in the depth direction, respectively, and the Schottky trenches 31 that penetrate through the $p^{++}$-type contact regions 6 and the p-type base region 4 in the depth direction and reach the n-type current spreading region 3 are formed. Here, this may be dry etching using an oxide film as an etching mask (not depicted). Subsequently, the etching mask used in the formation of the trenches is removed.

The gate trenches 7 and the Schottky trenches 31 may be formed concurrently or the gate trenches 7 and the Schottky trenches 31 may be formed by separate processes to have depths that differs from each other. After the formation of the gate trenches 7 and the Schottky trenches 31, to smooth the inner walls and upper ends of the gate trenches 7 and the Schottky trenches 31, a heat treatment may be performed under a hydrogen ($H_2$) atmosphere. The upper ends of the trenches are borders between the front surface of the semiconductor substrate 40 and the sidewalls of the trenches.

Next, by sacrificial oxidation, a sacrificial oxide film (not depicted) is formed along the front surface of the semiconductor substrate 40 and the inner walls of the gate trenches 7 and the Schottky trenches 31. Next, by a CVD method, a deposited oxide film (not depicted) is formed on the sacrificial oxide film on the front surface of the semiconductor substrate 40. A field oxide film is formed by the sacrificial oxide film and the deposited oxide film on the front surface of the semiconductor substrate 40. The deposited oxide film is further deposited on the sacrificial oxide film in the Schottky trenches 31 and is embedded in the Schottky trenches 31.

Next, by photolithography and etching, the field oxide film is selectively removed, leaving the field oxide film on the front surface of the semiconductor substrate 40 in the edge termination region 52. At this time, in the active region 51, the inner walls of the gate trenches 7, the $n^+$-type source regions 5, and the $p^{++}$-type contact regions 6 are exposed. In the Schottky trenches 31, the field oxide film (deposited oxide film) is left, protecting the inner walls of the Schottky trenches 31. Next, the gate insulating films 8 are formed along the inner walls of the gate trenches 7.

Next, for example, interface characteristics of the gate insulating films 8 and the silicon carbide (the semiconductor substrate 40) are improved by a heat treatment (post oxidation annealing (POA)) under a nitric oxide (NO) atmosphere. Next, a polysilicon (poly-Si) is deposited on the front surface of the semiconductor substrate 40, whereby the gate trenches 7 are embedded with the polysilicon. At this time, the polysilicon layer is further formed on the front surface of the semiconductor substrate 40 and thus, the polysilicon layer is patterned, leaving only portions of the polysilicon layer constituting the gate electrodes 9 in the gate trenches 7.

Next, a patterning mask (not depicted) of the polysilicon layer is removed and thereafter, a deposited oxide film constituting the interlayer insulating film 11 is deposited on the front surface of the semiconductor substrate 40 by a CVD method. Next, by photolithography and etching, the interlayer insulating film 11 is selectively removed, thereby forming the contact holes 11*a* and again exposing the $n^+$-type source regions 5 and the $p^{++}$-type contact regions 6 by the contact holes 11*a*. Next, by a sputtering method, a nickel film that constitutes a material film of the nickel silicide films 21 is deposited on the front surface of the semiconductor substrate 40.

Next, for example, by a heat treatment of a temperature in a range of about 400 degrees C. to 600 degrees C., portions of the nickel film on the front surface of the semiconductor substrate 40 are converted into a silicide. Next, portions of the nickel film not converted into a silicide, for example, are wet-etched, thereby removing the portions of nickel film on the interlayer insulating film 11 and the field oxide film. As a result, the portions of the nickel film converted into a silicide become the nickel silicide films 21 and are left on the front surface of the semiconductor substrate 40, in the contact holes 11*a*.

Next, on the back surface of the semiconductor substrate 40, for example, a nickel film and a titanium film are sequentially deposited and are converted into a silicide by, for example, a heat treatment of a temperature in a range of about 800 degrees C. to 1000 degrees C., thereby forming the drain electrode 14.

Next, by photolithography and etching, the interlayer insulating film 11 is selectively removed, the deposited oxide film in the Schottky trenches 31 is removed, and the inner walls of the Schottky trenches 31 are exposed. Next, a nickel film that constitutes a material film of the first metal films 32*a* of the trench-type SBDs 30 is deposited on the front surface of the semiconductor substrate 40 by a sputtering method. The nickel film is formed along the inner walls of the Schottky trenches 31 and is in contact with silicon carbide portions (the semiconductor substrate 40) only at the inner walls of the Schottky trenches 31. Next, portions of the nickel film on the inner walls of the Schottky trenches 31 are converted into a silicide by a heat treatment of a temperature in a range of about, for example, 400 degrees C. to 600 degrees C.

Next, portions of the nickel film not converted into a silicide, for example, are wet-etched, thereby removing portions of the nickel film other than those in the Schottky trenches 31. As a result, the portions of the nickel film converted into a silicide constitute the first metal films 32*a* and are left along the inner walls of the Schottky trenches 31. In an instance in which the first metal films 32*a* of the trench-type SBDs 30 are a titanium film or a tungsten film, the process of forming the nickel film along the inner walls of the Schottky trenches 31 and the process of converting the nickel film into a silicide are omitted and after the formation of the drain electrode 14, later-described processes (formation of the titanium nitride films 22 and subsequent processes) suffice to be performed.

Next, for example, the titanium nitride films 22 are deposited on the front surface of the semiconductor substrate 40 by a sputtering method and are left only on the surface of the interlayer insulating film 11. Next, for example, the titanium films 23 is deposited on the front surface of the semiconductor substrate 40 by a sputtering method. The titanium films 23 cover the nickel silicide films 21 and the titanium nitride films 22. At this time, the titanium films are formed at the inner walls of the Schottky trenches 31 as well. In an instance in which the first metal films 32*a* of the trench-type SBDs 30 are a titanium film, the sputtering time, etc. are adjusted so that the titanium films 23 are deposited without the Schottky trenches 31 being completely embedded with the titanium film, and portions of the titanium films 23 formed along the inner walls of the Schottky trenches 31 suffice to constitute the first metal films 32*a*. In an instance in which the first metal films 32*a* of the trench-type SBDs 30 are a nickel film or a tungsten film, the titanium film at the inner walls of the Schottky trenches 31 suffices to be removed.

Next, the titanium films 23 are fired, for example, by annealing at a temperature in a range of about 400 degrees to 600 degrees C. The titanium nitride films 22 and the titanium films 23 function as a barrier metal. A barrier metal has a function of preventing interaction between metal films configuring the barrier metal or between regions facing and sandwiching the barrier metal. The first metal films 32*a* at the inner walls of the Schottky trenches 31 are free of annealing. As a result, the Schottky barriers (Schottky junctions) are formed at the junction interfaces 33 between the n-type current spreading region 3 and the first metal films 32*a* of the conductive films 32.

Next, the second metal films 32*b* are deposited on the first metal films 32*a* so as to be embedded in the Schottky trenches 31. In an instance in which the second metal films 32*b* of the trench-type SBDs 30 are an aluminum film, for example, the aluminum film is deposited by the reflow sputtering method. In an instance in which the second metal films 32*b* of the trench-type SBDs 30 are a tungsten film, for example, the tungsten film is deposited by a CVD method. As a result, the Schottky trenches 31 are embedded with the second metal films 32*b*. Further, the second metal films 32*b* are formed on the front surface of the semiconductor substrate 40.

Next, portions of the second metal films 32*b* on the front surface of the semiconductor substrate 40 are removed by, for example, chemical mechanical polishing (CMP) or etching, leaving only portions of the second metal films 32*b* in the Schottky trenches 31. The second metal films 32*b* may protrude outward (upward) from inside the Schottky trenches 31. By the processes up to here, the trench-type SBDs 30 in which the conductive films 32 configured by the first and second metal films 32*a*, 32*b* are embedded in the Schottky trenches 31 are formed.

Next, for example, by a physical vapor deposition (PVD) method or a CVD method, the aluminum film 24 is deposited on the titanium films 23 and the conductive films 32. Subsequently, the aluminum film 24 is fired by a heat treatment. The source electrode 12 is configured by the nickel silicide films 21, the titanium nitride films 22, the titanium films 23, and the aluminum film 24. Thereafter, the semiconductor substrate (semiconductor wafer) 40 is diced (cut) into individual chips, whereby the silicon carbide semiconductor device 10 in FIGS. 1 and 2 is completed.

As described above, according to the first embodiment, the conductive films embedded in the Schottky trenches of the trench-type SBDs are configured by two metal films of different materials (two types including a titanium film, a nickel film, or a tungsten film; and an aluminum film or a tungsten film). By the titanium film, the nickel film, and the tungsten film, degradation of forward characteristics of the parasitic diodes of the MOSFET is suppressed by the Schottky characteristics thereof. By the nickel film and the tungsten film, the short-circuit withstand capability of the MOSFET is enhanced by the Schottky characteristics thereof. The resistance of the trench-type SBDs is reduced by the tungsten film and the aluminum film, which have a low electrical resistivity.

Figure 7:
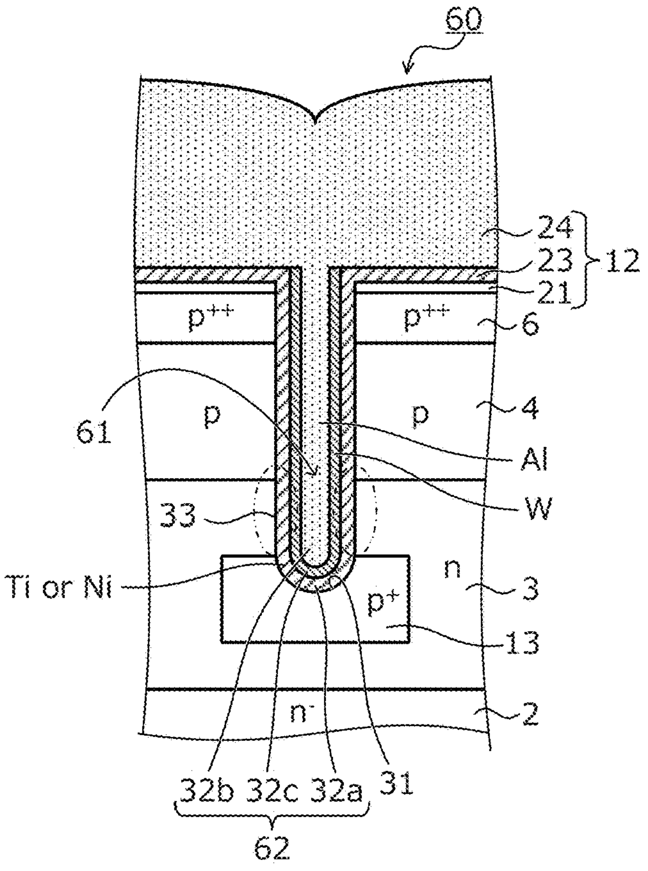
FIG. 7 is a cross-sectional view depicting a structure of a silicon carbide semiconductor device according to a second embodiment.
Figure 8:
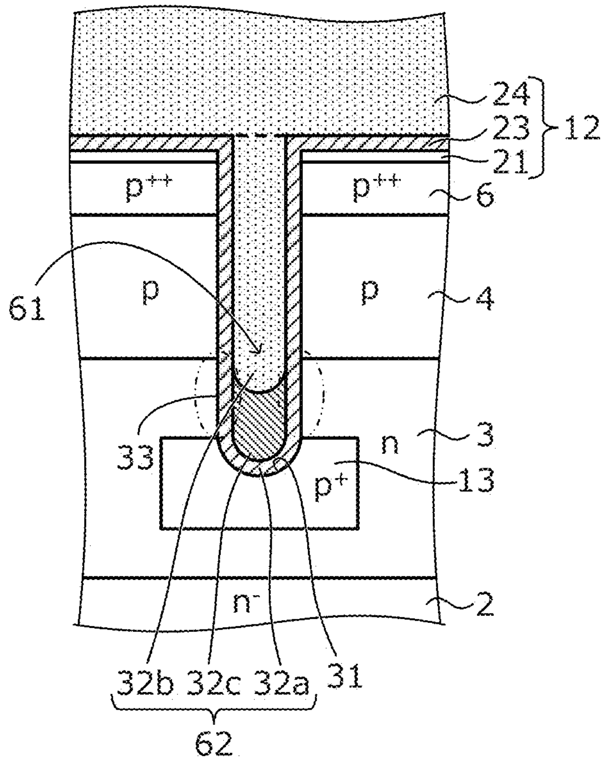
FIG. 8 is a cross-sectional view depicting another example of the trench-type SBD depicted in FIG. 7.

A structure of a silicon carbide semiconductor device according to a second embodiment is described. FIG. 7 is a cross-sectional view depicting the structure of the silicon carbide semiconductor device according to the second embodiment. FIG. 7 depicts only a vicinity of a trench-type SBD 61 of the silicon carbide semiconductor device 60 according to the second embodiment. FIG. 8 is a cross-sectional view depicting another example of the trench-type SBD depicted in FIG. 7. Each of the silicon carbide semiconductor devices 60 according to the second embodiment depicted in FIGS. 7 and 8 has a configuration that, with an exception of conductive films 62 of the trench-type SBDs 61, is similar to that of the silicon carbide semiconductor device 10 according to the first embodiment (refer to FIGS. 1 and 2).

The silicon carbide semiconductor device 60 according to the second embodiment differs from the silicon carbide semiconductor device 10 according to the first embodiment in that the conductive film 62 of each of the trench-type SBDs 61 is configured by three metal films (hereinafter, first, second, and third metal films) 32*a*, 32*b*, 32*c*. In particular, in the second embodiment, the first metal film 32*a* of the conductive film 62 is a titanium film or a nickel film provided along the inner wall of the Schottky trench 31. The arrangement and function of the first metal film 32*a* of the conductive film 62 are similar to those of the first metal films 32*a* of the first embodiment.

The second metal film 32*b* of the conductive film 62 is an aluminum film partially embedded closer to the center of the Schottky trench 31 than is the first metal film 32*a*. A function of the second metal film 32*b* of the conductive film 62 is that the same as that in an instance in which the second metal films 32*b* of the first embodiment are an aluminum film. The third metal film 32*c* of the conductive film 62 is a tungsten film partially provided closer to the center portion of the Schottky trench 31 than is the first metal film 32*a*. The third metal film 32*c* of the conductive film 62 is that same as an instance in which the second metal films 32*b* of the first embodiment are a tungsten film.

Between the first metal film 32*a* and the second metal film 32*b*, the third metal film 32*c* may be provided along an entire area of the inner wall of the Schottky trench 31 (FIG. 7). In this instance, the second metal film 32*b* is embedded closer to the center of the Schottky trench 31 than is the third metal film 32*c*. Further, closer to the center of the Schottky trench 31 than is the first metal film 32*a*, the third metal film 32*c* may be embedded toward the bottom of the Schottky trench 31 and the second metal film 32*b* may be embedded closer to the source electrode 12 than is the third metal film 32*c* (FIG. 8).

In the trench-type SBD 61 of the second embodiment depicted in FIGS. 7 and 8, temperature increases of the second metal films 32*b* during short-circuit of the MOSFET may be delayed by the third metal films 32*c* of a high melting point, provided between the second metal films 32*b* (aluminum films) of a low melting point and configuring the conductive film 62 and locations (near the bottoms of the gate trenches 7) where heat is generated during short-circuit between the source and gate of the MOSFET. As a result, during short-circuit of the MOSFET, the second metal films 32*b* (aluminum films) are resistant to melting and thus, the short-circuit withstand capability of the MOSFET may be further enhanced.

In particular, in each of the trench-type SBDs 61 of the second embodiment depicted in FIG. 8, the third metal film 32*c* (tungsten film) is disposed relatively thickly near the bottom of the Schottky trenches 31, whereby the melting point of the conductive film 62 may be increased at positions near locations (near the bottoms of the gate trenches 7) where heat is generated during short-circuit of the MOSFET. As a result, temperature increases of the second metal films 32*b* during short-circuit of the MOSFET may be further delayed and since the second metal films 32*b* become further resistant to melting, the short-circuit withstand capability of the MOSFET may be further enhanced.

A method of manufacturing the silicon carbide semiconductor device 60 according to the second embodiment suffices to be implemented by forming the third metal film 32*c* of the conductive film 62 (tungsten film) by a CVD method, along the entire surface of the first metal films 32*a* or on the first metal films 32*a* so as to be embedded at the bottoms of the Schottky trenches 31, in the method of manufacturing the silicon carbide semiconductor device 10 according to the first embodiment, the third metal film 32*c* being formed after the first metal film 32*a* of the conductive film 62 is formed along the inner walls of the Schottky trenches 31 but before the second metal film 32*b* of the conductive film 62 (the aluminum film) is embedded in the Schottky trenches 31 by the reflow sputtering method.

The configuration of the first metal films 32*a* of the trench-type SBDs 30 depicted in FIGS. 3 and 4 may be applied to the silicon carbide semiconductor device 60 according to the second embodiment, the first metal films 32*a* of the trench-type SBDs 61 are provided only at portions of the inner walls of the Schottky trenches 31 (refer to FIG. 3), portions of the first metal films 32*a* of the trench-type SBDs 61 may be thicker at the bottoms of the Schottky trenches 31 than are portions of the first metal films 32*a* at the sidewalls (refer to FIG. 4). In an instance in which the first metal films 32*a* of the trench-type SBDs 61 are provided only at portions of the inner walls of the Schottky trenches 31 (refer to FIG. 3), the third metal film 32*c* of the conductive film 62 may be in contact with the silicon carbide portions.

As described above, according to the second embodiment, effects based on the properties (thermal properties, electrical properties) of the three films: the first to third metal films (three types including a titanium film or a nickel film, an aluminum film, and a tungsten film) that are of different materials and that configure the conductive films that are embedded in the Schottky trenches of the trench-type SBD may be obtained. As a result, all the effects (suppression of the degradation of forward characteristics of the parasitic diodes of the MOSFET, enhancement of the short-circuit withstand capability of the MOSFET, reduction of the resistance of the trench-type SBDs 30) obtained by the first embodiment may be further obtained.

In the foregoing, the present invention is not limited to the embodiments described above and various modifications within a range not departing from the spirit of the invention are possible. For example, in the embodiments described above, dimensions, impurity concentrations, etc. of regions in the semiconductor substrate may be variously set according to necessary specifications. Further, the present invention is applicable to semiconductor devices that have trench-type SBDs on a single semiconductor substrate having a MOSFET, and other devices, circuits, etc. may be further provided on the semiconductor substrate.

The silicon carbide semiconductor device and the method of manufacturing a silicon carbide semiconductor device according to the present invention achieve an effect in that degradation of forward characteristics of parasitic diodes is suppressed, or degradation of forward characteristics of parasitic diodes is suppressed and short-circuit withstand capability is enhanced, while resistance of built-in SBDs may be reduced.

As described above, the silicon carbide semiconductor device and the method of manufacturing a silicon carbide semiconductor device according to the present invention are useful for power semiconductor devices used in power converting equipment, power source devices such those of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a semiconductor substrate containing silicon carbide, the semiconductor substrate having a first main surface and a second main surface that are opposite to each other;

a first semiconductor region of a first conductivity type, provided in the semiconductor substrate;

a second semiconductor region of a second conductivity type, provided in the semiconductor substrate and between the first main surface of the semiconductor substrate and the first semiconductor region;

a plurality of third semiconductor regions of the first conductivity type, selectively provided in the semiconductor substrate and between the first main surface of the semiconductor substrate and the second semiconductor region;

a plurality of trenches including a plurality of first trenches and a plurality of second trenches different from each other, the plurality of first trenches penetrating through the plurality of third semiconductor regions and the second semiconductor region and reaching the first semiconductor region, the plurality of second trenches being provided apart from the plurality of third semiconductor regions, penetrating through the second semiconductor region and reaching the first semiconductor region;

a plurality of gate electrodes respectively provided in the plurality of first trenches, via a plurality of gate insulating films;

a plurality of conductive films respectively embedded in the plurality of second trenches, each of the plurality of conductive films being configured by a plurality of stacked metal films made of materials different from one another, junction interfaces between the first semiconductor region and the plurality of conductive films forming a plurality of Schottky barriers;

a first electrode electrically connected to the second semiconductor region, the plurality of third semiconductor regions, and the plurality of conductive films, the first electrode including an aluminum film or an aluminum alloy film;

a second electrode provided at the second main surface of the semiconductor substrate; and a plurality of Schottky barrier diodes that respectively include the plurality of Schottky barriers, wherein each of the plurality of conductive films has:

a first metal film provided along an inner wall of a respective one of the plurality of second trenches, the first metal film being in Schottky contact with the first semiconductor region, at the inner wall of the respective one of the plurality of second trenches, and a second metal film provided closer to a center of the respective one of the plurality of second trenches than is the first metal film, the second metal film having an electrical resistivity that is lower than an electrical resistivity of the first metal film, the first metal film is a nickel film, the second metal film is a tungsten film, and the first metal film has:

a first portion at a bottom of the respective one of the plurality of second trenches, and a second portion at a sidewall of the respective one of the plurality of second trenches, a thickness of the second portion being smaller than a thickness of the second metal film.

2. The silicon carbide semiconductor device according to claim 1, wherein the first metal film is provided only on the first semiconductor region at the inner wall of the respective one of the plurality of second trenches.

3. The silicon carbide semiconductor device according to claim 1, wherein the first portion of the first metal film is thicker than the second portion.

4. The silicon carbide semiconductor device according to claim 1, wherein the thickness of the second portion of the first metal film is in a range of 100 nm to 200 nm.

5. A method of manufacturing the silicon carbide semiconductor device according to claim 1, the method comprising:

stacking the plurality of metal films in each of the plurality of second trenches to thereby form the plurality of conductive films, the stacking including performing chemical vapor deposition to form the tungsten film in each of the plurality of conductive film.

6. A method of manufacturing the silicon carbide semiconductor device according to claim 1, the method comprising:

stacking the plurality of metal films in each of the plurality of second trenches to thereby form the plurality of conductive films, the stacking including performing reflow sputtering to further form an aluminum film in each of the plurality of conductive films.

7. The silicon carbide semiconductor device according to claim 1, wherein the plurality of conductive films are not in contact with the plurality of third semiconductor regions.

8. The silicon carbide semiconductor device according to claim 1, further comprising:

a plurality of contact regions of the second conductivity type, selectively provided in the semiconductor substrate and between the first main surface of the semiconductor substrate and the second semiconductor region, the plurality of contact regions having a higher impurity concentration than the second semiconductor region, wherein the plurality of trenches extend in a striped pattern in a direction that is parallel to the first main surface of the semiconductor substrate, and the plurality of third semiconductor regions and the plurality of contact regions extend linearly in the direction.

* * * * *